(12) United States Patent
Noh et al.

(10) Patent No.: US 11,319,449 B2
(45) Date of Patent: May 3, 2022

(54) AREA SELECTIVE DEPOSITION OF METAL CONTAINING FILMS

(71) Applicant: L'Air Liquide, Société Anonyme pour l'Etude et l'Exploitation des Procédés Georges Claude, Paris (FR)

(72) Inventors: Wontae Noh, Seoul (KR); Jooho Lee, Seoul (KR); Jean-Marc Girard, Versailles (FR)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 222 days.

(21) Appl. No.: 16/723,771

(22) Filed: Dec. 20, 2019

(65) Prior Publication Data

US 2021/0189146 A1 Jun. 24, 2021

(51) Int. Cl.
*H01L 21/31* (2006.01)
*C09D 1/00* (2006.01)
(Continued)

(52) U.S. Cl.
CPC ................ *C09D 1/00* (2013.01); *C01F 7/304* (2013.01); *C07F 5/069* (2013.01); *C23C 16/04* (2013.01);
(Continued)

(58) Field of Classification Search
CPC ......... H01L 21/02178; H01L 21/02205; H01L 21/0228; C07F 5/06; C07F 5/061;
(Continued)

(56) References Cited

U.S. PATENT DOCUMENTS

| | | |
|---|---|---|
| 5,908,947 A | 6/1999 | Vaartstra |
| 6,596,890 B1 | 7/2003 | Poetsch et al. |
| (Continued) | | |

FOREIGN PATENT DOCUMENTS

JP 2005 72490 3/2005

OTHER PUBLICATIONS

Barry, S.T. et al., Monomeric chelated amides of aluminum and gallium: volatile, miscible liquid precursors for CVD, Mat. Res. Soc. Symp. Proc., 2000, vol. 606, 83-89.
(Continued)

*Primary Examiner* — Brook Kebede
(74) *Attorney, Agent, or Firm* — Yan Jiang

(57) ABSTRACT

Processes of selectively depositing a metal-containing film comprise: providing a surface having a plurality of materials exposed thereon simultaneously, and exposing the surface to a vapor of a metal-containing film-forming composition that contains a precursor having the formula:

$$L_xM(-N(R)-(CR'_2)_n-NR''_2)$$

wherein M is a Group 12, Group 13, Group 14, Group 15, Group IV or Group V element; x+1 is the oxidation state of the M; L is an anionic ligand, independently selected from dialkylamine, alkoxy, alkylimine, bis(trialkylsilylamine), amidinate, betadiketonate, keto-imine, halide, or the like; R, R" each are independently a $C_1$-$C_{10}$ linear, branched or cyclic alkyl, alkenyl, or trialkylsilyl group; R' is H or a $C_1$-$C_{10}$ linear, branched or cyclic alkyl, alkenyl or trialkylsilyl group; n=1-4,
wherein at least one of the materials is at least partially blocked by a blocking agent from the deposition of the metal-containing film through a vapor deposition process.

20 Claims, 4 Drawing Sheets

(51) Int. Cl.
*C01F 7/304* (2022.01)
*C07F 5/06* (2006.01)
*H01L 21/02* (2006.01)
*C23C 16/40* (2006.01)
*C23C 16/04* (2006.01)
*C23C 16/455* (2006.01)

(52) U.S. Cl.
CPC ...... *C23C 16/403* (2013.01); *C23C 16/45553* (2013.01); *H01L 21/0228* (2013.01); *H01L 21/02178* (2013.01); *H01L 21/02205* (2013.01)

(58) Field of Classification Search
CPC .......... C07F 5/069; C01F 7/304; C23C 16/04; C23C 16/403; C23C 16/45553
USPC ........................................................ 438/778
See application file for complete search history.

(56) References Cited

U.S. PATENT DOCUMENTS

| | | | |
|---|---|---|---|
| 2003/0176065 | A1 | 9/2003 | Vaartstra |
| 2005/0012975 | A1* | 1/2005 | George .............. G02B 26/0866 438/48 |
| 2006/0193984 | A1 | 8/2006 | Peters et al. |
| 2007/0299274 | A1 | 12/2007 | Meiere |
| 2009/0112009 | A1 | 4/2009 | Chen et al. |
| 2015/0004314 | A1 | 1/2015 | Winter et al. |
| 2015/0266904 | A1 | 9/2015 | Yoshino et al. |
| 2018/0076024 | A1* | 3/2018 | Park ................... H01L 27/2427 |
| 2019/0080904 | A1 | 3/2019 | Anthis et al. |
| 2019/0164762 | A1 | 5/2019 | Su et al. |
| 2019/0276612 | A1* | 9/2019 | Inaba ........................ C01F 7/36 |
| 2020/0325573 | A1* | 10/2020 | Illiberi .................. C23C 16/403 |

OTHER PUBLICATIONS

Beachley, O.T. Jr. et al., Chelation in organoaluminum-nitrogen chemistry, Inorganic Chemistry, vol. 15, No. 9, 1976, 2110-2115.

Beachley, O.T. Jr. et al., Preparation and properties of a neutral, chelated four-coordinate organoaluminum-nitrogen derivative, Inorganic Chemistry, vol. 14, No. 10, 1975, 2534-2537.

Blakeney, K.J. et al., Atomic layer deposition of aluminum metal films using a thermally stable aluminum hydride reducing agent, Chem. Mater., 2018, 30, 1844-1848.

Choi, H. et al., Volatile amidoalane compounds for chemical vapor deposition of aluminum, Chem Mater., 1998, 10, 2323-2325.

McMahon, C.N. et al., Aluminium compounds containing bidentate ligands: ligand base strength and remote geometric control over degree of association, J. Chem. Soc., Dalton Trans., 1999, 67-72.

Park, J.E. et al., Reactions of $AlR_3$ (R=Me, Et) with $H_2NCH_2CH_2NMe_2$: synthesis and characterization of amido- and imidoalanes, Organometallics 1999, 18, 1059-1067.

Wissing, E. et al., An unexpected 1,2-alkyl shift within a chelate bonded organoaluminium-enamine, Journal of Organometallic Chemistry, 459, 1993, 11-16.

Zaworotko, M.J. et al., Crystal and molecular structure of $Cl_2AlN(C_2H_5)C_2H_4N(CH_3)_2$, a neutral, chelated four-coordinate aluminum compound, which contains two types of Al—N bond, Inorg. Chem. 1980, 19, 268-270.

International Search Report and Written Opinion for corresponding PCT/US2020/066058, dated Apr. 20, 2021.

* cited by examiner

AREA SELECTIVE DEPOSITION OF METAL CONTAINING FILMS

TECHNICAL FIELD

The present invention relates to processes of area selective deposition (ASD) of a metal containing film using a metal containing precursor. In particular, the metal is a Group 12, Group 13, Group 14, Group 15, Group IV or Group V metal.

BACKGROUND

Due to continuous scaling down of semiconductor devices, typical lithography is about to reach its physical limitation at which structural flaws will become unavoidable, such as misalignment of contacts. Difficulty of accurate pattern alignment is increasingly difficult and the biggest issue has been "edge placement error (EPE)". Hence, the current top-down technology needs to be changed to bottom-up technology using area selective deposition (ASD) techniques in combination with self-assembled monolayers (SAMs) or inhibitor formation on surface.

In practice, it is extremely difficult to achieve perfect growth selectivity. This translates by a parasitic growth on a blocked surface, which starts on defects of an inhibited surface (available active sites like —OH, etc.). This effect limits the maximum thickness grown on a non-protected surface before a film growth happens on the inhibited surface. To be of industrial interest, such thickness on a non-protected surface should be maximized, and parasitic growth on the inhibited surface (i.e. that translates into defect islands at the early stage of the growth) should be suppressed at least to a degree that avoids imparment of the resulting strycture's function within the finished device and ideally to the maximum extent possible.

Metal oxides are commonly used materials for their specific physical properties (insulating properties, high dielectric constant, etch resistance, refractive index, etc.) and the selective growth of metal oxide is of interest in the semiconductor industry. $Al_2O_3$ is a common metal oxide material. A common precursor for forming $Al_2O_3$ is $Al_2Me_6$ (TMA), as it has almost all the requirements of a perfect atomic layer deposition (ALD) precursor, such as, volatile, fast saturation, high surface reactivity, etc. However, for the ASD, TMA suffers from its extreme reactivity and oxophilic character, as it tends to react with oxygen that bridges the surface to the SAM, thus starting the growth of a film on the protected region. As such, the usage of O-containing inhibitor, such as carboxylic acids, phosphonic acids, acetates, beta-diketonate, etc. or O-binded SAMs, such as —O-TMS (trimetylsilane), O-DMS (dimethylsilane)-O, O—Si—R, etc. is not compatible with the usage of highly oxophilic precursors like TMA.

Discovery of new and novel precursors that are applicable to the ASD is challenging due to the difficulties described above. Thus, there are needs to provide such precursors to meet the requirements of the ASDs.

US2006193984 discloses processes for producing the organoaluminum precursor compounds and a method for producing a film or coating from the organoaluminum precursor compounds. The organoaluminum precursor compound represented by the formula:

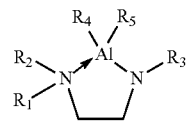

wherein $R_1$, $R_2$, $R_3$ and $R_4$ are the same or different and each represents hydrogen or an alkyl group having from 1 to about 3 carbon atoms, and $R_5$ represents an alkyl group having from 1 to about 3 carbon atoms.

US2015266904 discloses a compound has a low melting temperature, sufficient volatility, and high thermal stability suited for use as a material for thin film formation by CVD. The aluminum compound represented by a general formula:

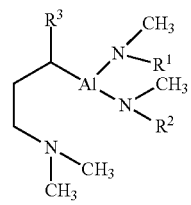

wherein $R_1$ and $R_2$ each independently represent a straight or branched alkyl group having 2 to 5 carbon atoms; and $R_3$ represents a methyl group or an ethyl group.

Beachly et al. (Inorganic Chemistry, Vol. 15, No. 9, 1976, 2110-2115) discloses chelation in organoaluminum-nitrogen chemistry including the chelated monomer for the compounds $(CH_3)_2Al(C_2H_5)NC_2H_4N(C_2H_5)_2$, $(C_2H_5)_2Al(CH_3)NC_2H_4N(CH_3)_2$, $(C_6H_5)_2Al(C_2H_5)NC_2H_4N(CH_3)_2$, $Cl_2Al(C_2H_5)NC_2H_4N(CH_3)_2$, and $(CH_3)_2AlSC_2H_4N(CH_3)_2$, having the structure:

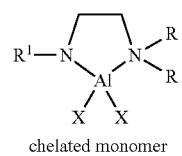

chelated monomer

Barry et al. (Mat. Res. Soc. Symp. Proc., Vol. 606, p 83-89, 2000) discloses monomeric chelated amides of aluminum and gallium: volatile, miscible liquid precursors for CVD. The aluminum nitride (AlN) and gallium nitride (GaN) have the following structure:

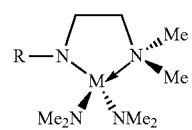

Blakeney et al. (Inorganic. Nucl. Chem. Lett., 9, 423 (1973)) discloses ALD of aluminum metal films using a thermally stable aluminum hydride reducing agent, in which volatile dimeric Al dihydride complexes coordinated by simple amido-amine ligands of the formula $(RN)CH_2CH_2(NMe_2)$ (R=Me, Et) have the following structure.

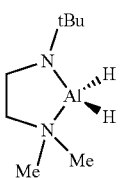

McMahon et al. (J. Chem., Soc., Dalton Trans., 1999, 67-72) discloses aluminium compounds containing bidentate ligands: ligand base strength and remote geometric control over degree of association, in which (tBu)$_2$Al[N(Me)CH$_2$CH$_2$NMe$_2$] is yielded and has the structure:

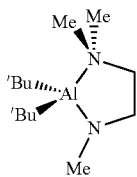

Choi et al. (Chem. Mater., 10, 2323-2325, 1998) discloses volatile Amidoalane Compounds for CVD of Aluminum, H$_2$Al{N(Et)C$_2$H$_4$NMe$_2$} (1, DMEEDA), H$_2$Al{N(Me)C$_2$H$_4$NMe$_2$} (2, TRMEDA) and H$_2$Al{N(Et)C$_2$H$_4$NEt$_2$} (3, TREEDA),

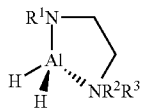

R$^1$ = Et; R$^2$, R$^3$ = Me, 1
R$^1$ = Me; R$^2$, R$^3$ = Me, 2
R$^1$ = Et; R$^2$, R$^3$ = Et, 3

Wissing et al. (Journal of Organometallic Chemistry, 459, 11-16, 1993) discloses 1,2-alkyl shift within a chelate bonded organoaluminium-enamine 1c-3c,

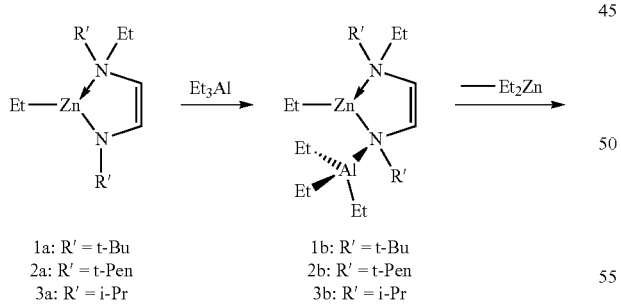

1a: R' = t-Bu
2a: R' = t-Pen
3a: R' = i-Pr

1b: R' = t-Bu
2b: R' = t-Pen
3b: R' = i-Pr

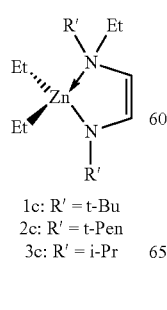

1c: R' = t-Bu
2c: R' = t-Pen
3c: R' = i-Pr

SUMMARY

Disclosed is a process of selectively depositing a metal-containing film comprising the steps of:
a) providing a surface having a plurality of materials exposed thereon simultaneously; and
b) exposing the surface to a vapor of a metal-containing film-forming composition that contains a precursor having the formula:

$$L_xM(-N(R)-(CR'_2)_n-NR''_2)$$

wherein M is a Group 12, Group 13, Group 14, Group 15, Group IV or Group V element; x+1 is the oxidation state of the M; L is an anionic ligand; R, R" each are independently a $C_1$-$C_{10}$ linear, branched or cyclic alkyl, alkenyl, or trialkylsilyl group; R' is H or a $C_1$-$C_{10}$ linear, branched or cyclic alkyl, alkenyl or trialkylsilyl group; n=1-4; and
c) preferentially or selectively depositing a film on one or more of, but less than all of, the plurality of materials on the surface in a vapor deposition process,
wherein at least one of the materials on the surface is at least partially blocked by a blocking agent thereby reducing or preventing a deposition of the metal-containing film on said blocked material.

Also, the disclosed is a process of selectively depositing Al$_2$O$_3$ film comprising the steps of:
a) providing a surface having at least one dielectric material and at least one metal material exposed thereon simultaneously;
b) exposing the surface to a vapor of (NMe$_2$)$_2$Al(—NEt-(CH$_2$)$_2$—NEt$_2$); and
c) exposing the surface to a co-reactant H$_2$O;
wherein the at least one dielectric material is at least partially blocked by a blocking agent dimethyldichlorosilane (DMDCS) from the deposition of the Al$_2$O$_3$ film through an ALD process.

The disclosed processes may include one or more of the following aspects:
the vapor deposition process being an ALD process;
the process further comprising exposing the surface to a co-reactant selected from an oxidizer agent or a nitrigen agent;
the co-reactant being selected from O$_3$, O$_2$, H$_2$O, H$_2$O$_2$, D$_2$O, ROH wherein R=C$_1$-C$_{10}$ linear or branched hydrocarbon or combinations thereof;
the co-reactant being selected from NH$_3$, NO, N$_2$O, hydrazines, amines or combinations thereof;
the co-reactant being H$_2$O;
the blocking agent forming a SAM layer on the at least one of the materials by dipping the surface in the blocking agent or vapor spraying the surface with the blocking agent;
the plurality of the materials including at least a dielectric material and at least a metal material on the surface;
the metal-containing film being deposited on the dielectric film but not deposited on the metal film by blocking the reactivity of the metal film by a metal blocking agent;
the metal blocking agent being selected from a alkyl or fluoroalkyl compounds having a surface reactive chemical function group selected from phosphonic acids, carboxylic acids, thiols, or triazoles;
the metal-containing film being deposited on the metal material but not deposited on the dielectric material by blocking the reactivity of the dielectric material by a dielectric blocking agent;

the dielectric blocking agent being a compound having the formula $R_{4-a}SiX_a$, wherein each X are independently a surface hydroxyl reactive group (halide, alkylamino, alkoxy, acetamide, etc.), and each R are selected from H, a $C_1$-$C_{20}$ alkyl or fluoroalkyl group or mixture thereof;

a the surface being exposed to the precursor at a temperature raging from room temperature to approximately 500° C.;

the process further comprising the steps of repeating the exposing to the vapor of the metal-containing film-forming composition and the exposing to the co-reactant until a desired thickness of the metal-containing film is formed; and purging excess vapor of the metal-containing film-forming composition and excess co-reactant using an inert gas, respectively, to separate each exposure, wherein the inert gas is $N_2$, Ar, Kr or Xe;

the precursor being $(NMe_2)_2Al(-NEt-(CH_2)_2-NEt_2)$;

the blocking agent being dimethyldichlorosilane (DMDCS); and the metal-containing film being an $Al_2O_3$ film.

Also, disclosed is a composition for selective deposition of a metal-containing film comprising a precursor having the formula:

$$L_xM(-N(R)-(CR'_2)_n-NR''_2)$$

wherein M is a Group 12, Group 13, Group 14, Group 15, Group IV or Group V element; x+1 is the oxidation state of the M; L is an anionic ligand, independently selected from dialkylamine, alkoxy, alkylimine, bis(trialkylsilylamine), amidinate, betadiketonate, keto-imine, halide, or the like; R, R'' each are independently a $C_1$-$C_{10}$ linear, branched or cyclic alkyl, alkenyl, or trialkylsilyl group; R' is H or a $C_1$-$C_{10}$ linear, branched or cyclic alkyl, alkenyl or trialkylsilyl group; n=1-4.

The disclosed compositions include one or more of the following aspects:

M=Al;

M=B, Ga, In, lanthanide elements, P, As, Sb or Bi;

x=2;

L being a dialkylamino ligand $-NR^1R^2$ wherein $R^1$, $R^2$ each independently are a linear or branched alkyl group having 1 to 5 carbon atoms;

$R^1=R^2=Me$;

n=2;

R=Me, Et, Pr, Bu;

R'=H;

R''=Me, Et;

the precursor being $(NMe_2)_2Al(-NEt-(CH_2)_2-NEt_2)$;

the Al-containing precursor being selected from $(NMe_2)_2Al(-NMe-(CH_2)_2-NMe_2)$, $(NMe_2)_2Al(-NEt-(CH_2)_2-NMe_2)$, $(NMe_2)_2Al(-N_iPr-(CH_2)_2-NMe_2)$, $(NMe_2)_2Al(-N_nPr-(CH_2)_2-NMe_2)$, $(NMe_2)_2Al(-N_iBu-(CH_2)_2-NMe_2)$, $(NMe_2)_2Al(-N_nBu-(CH_2)_2-NMe_2)$, $(NMe_2)_2Al(-N_tBu-(CH_2)_2-NMe_2)$, $(NMe_2)_2Al(-N_sBu-(CH_2)_2-NMe_2)$, $(NEt_2)_2Al(-NMe-(CH_2)_2-NMe_2)$, $(NEt_2)_2Al(-NEt-(CH_2)_2-NMe_2)$, $(NEt_2)_2Al(-N_iPr-(CH_2)_2-NMe_2)$, $(NEt_2)_2Al(-N_nPr-(CH_2)_2-NMe_2)$, $(NEt_2)_2Al(-N_iBu-(CH_2)_2-NMe_2)$, $(NEt_2)_2Al(-N_nBu-(CH_2)_2-NMe_2)$, $(NEt_2)_2Al(-N_tBu-(CH_2)_2-NMe_2)$, $(NEt_2)_2Al(-N_sBu-(CH_2)_2-NMe_2)$, $(N_iPr_2)_2Al(-NMe-(CH_2)_2-NMe_2)$, $(N_iPr_2)_2Al(-NEt-(CH_2)_2-NMe_2)$, $(N_iPr_2)_2Al(-N_iPr-(CH_2)_2-NMe_2)$, $(N_iPr_2)_2Al(-N_nPr-(CH_2)_2-NMe_2)$, $(N_iPr_2)_2Al(-N_iBu-(CH_2)_2-NMe_2)$, $(N_iPr_2)_2Al(-N_nBu-(CH_2)_2-NMe_2)$, $(N_iPr_2)_2Al(-N_tBu-(CH_2)_2-NMe_2)$, $(N_iPr_2)_2Al(-N_sBu-(CH_2)_2-NMe_2)$, $(N_nPr_2)_2Al(-NMe-(CH_2)_2-NMe_2)$, $(N_nPr_2)_2Al(-NEt-(CH_2)_2-NMe_2)$, $(N_nPr_2)_2Al(-N_iPr-(CH_2)_2-NMe_2)$, $(N_nPr_2)_2Al(-N_nPr-(CH_2)_2-NMe_2)$, $(N_nPr_2)_2Al(-N_iBu-(CH_2)_2-NMe_2)$, $(N_nPr_2)_2Al(-N_nBu-(CH_2)_2-NMe_2)$, $(N_nPr_2)_2Al(-N_tBu-(CH_2)_2-NMe_2)$, $(N_nPr_2)_2Al(-N_sBu-(CH_2)_2-NMe_2)$, $(N_iBu_2)_2Al(-NMe-(CH_2)_2-NMe_2)$, $(N_iBu_2)_2Al(-NEt-(CH_2)_2-NMe_2)$, $(N_iBu_2)_2Al(-N_iPr-(CH_2)_2-NMe_2)$, $(N_iBu_2)_2Al(-N_nPr-(CH_2)_2-NMe_2)$, $(N_iBu_2)_2Al(-N_iBu-(CH_2)_2-NMe_2)$, $(N_iBu_2)_2Al(-N_nBu-(CH_2)_2-NMe_2)$, $(N_iBu_2)_2Al(-N_tBu-(CH_2)_2-NMe_2)$, $(N_iBu_2)_2Al(-N_sBu-(CH_2)_2-NMe_2)$, $(N_nBu_2)_2Al(-NMe-(CH_2)_2-NMe_2)$, $(N_nBu_2)_2Al(-NEt-(CH_2)_2-NMe_2)$, $(N_nBu_2)_2Al(-N_iPr-(CH_2)_2-NMe_2)$, $(N_nBu_2)_2Al(-N_nPr-(CH_2)_2-NMe_2)$, $(N_nBu_2)_2Al(-N_iBu-(CH_2)_2-NMe_2)$, $(N_nBu_2)_2Al(-N_nBu-(CH_2)_2-NMe_2)$, $(N_nBu_2)_2Al(-N_tBu-(CH_2)_2-NMe_2)$, $(N_nBu_2)_2Al(-N_sBu-(CH_2)_2-NMe_2)$, $(N_tBu_2)_2Al(-NMe-(CH_2)_2-NMe_2)$, $(N_tBu_2)_2Al(-NEt-(CH_2)_2-NMe_2)$, $(N_tBu_2)_2Al(-N_iPr-(CH_2)_2-NMe_2)$, $(N_tBu_2)_2Al(-N_nPr-(CH_2)_2-NMe_2)$, $(N_tBu_2)_2Al(-N_iBu-(CH_2)_2-NMe_2)$, $(N_tBu_2)_2Al(-N_nBu-(CH_2)_2-NMe_2)$, $(N_tBu_2)_2Al(-N_tBu-(CH_2)_2-NMe_2)$, $(N_tBu_2)_2Al(-N_sBu-(CH_2)_2-NMe_2)$, $(N_sBu_2)_2Al(-NMe-(CH_2)_2-NMe_2)$, $(N_sBu_2)_2Al(-NEt-(CH_2)_2-NMe_2)$, $(N_sBu_2)_2Al(-N_iPr-(CH_2)_2-NMe_2)$, $(N_sBu_2)_2Al(-N_nPr-(CH_2)_2-NMe_2)$, $(N_sBu_2)_2Al(-N_iBu-(CH_2)_2-NMe_2)$, $(N_sBu_2)_2Al(-N_nBu-(CH_2)_2-NMe_2)$, $(N_sBu_2)_2Al(-N_tBu-(CH_2)_2-NMe_2)$, $(N_sBu_2)_2Al(-N_sBu-(CH_2)_2-NMe_2)$, $(NMe_2)_2Al(-NMe-(CH_2)_2-NEt_2)$, $(NMe_2)_2Al(-NEt-(CH_2)_2-NEt_2)$, $(NMe_2)_2Al(-N_iPr-(CH_2)_2-NEt_2)$, $(NMe_2)_2Al(-N_nPr-(CH_2)_2-NEt_2)$, $(NMe_2)_2Al(-N_sBu-(CH_2)_2-NEt_2)$, $(NMe_2)_2Al(-N_nBu-(CH_2)_2-NEt_2)$, $(NMe_2)_2Al(-N_tBu-(CH_2)_2-NEt_2)$, $(NMe_2)_2Al(-N_sBu-(CH_2)_2-NEt_2)$, $(NEt_2)_2Al(-NMe-(CH_2)_2-NEt_2)$, $(NEt_2)_2Al(-NEt-(CH_2)_2-NEt_2)$, $(NEt_2)_2Al(-N_iPr-(CH_2)_2-NEt_2)$, $(NEt_2)_2Al(-N_nPr-(CH_2)_2-NEt_2)$, $(NEt_2)_2Al(-N_iBu-(CH_2)_2-NEt_2)$, $(NEt_2)_2Al(-N_nBu-(CH_2)_2-NEt_2)$, $(NEt_2)_2Al(-N_tBu-(CH_2)_2-NEt_2)$, $(NEt_2)_2Al(-N_sBu-(CH_2)_2-NEt_2)$, $(N_iPr_2)_2Al(-NMe-(CH_2)_2-NEt_2)$, $(N_iPr_2)_2Al(-NEt-(CH_2)_2-NEt_2)$, $(N_iPr_2)_2Al(-N_iPr-(CH_2)_2-NEt_2)$, $(N_iPr_2)_2Al(-N_nPr-(CH_2)_2-NEt_2)$, $(N_iPr_2)_2Al(-N_iBu-(CH_2)_2-NEt_2)$, $(N_iPr_2)_2Al(-N_nBu-(CH_2)_2-NEt_2)$, $(N_iPr_2)_2Al(-N_tBu-(CH_2)_2-NEt_2)$, $(N_iPr_2)_2Al(-N_sBu-(CH_2)_2-NEt_2)$, $(N_nPr_2)_2Al(-NMe-(CH_2)_2-NEt_2)$, $(N_nPr_2)_2Al(-NEt-(CH_2)_2-NEt_2)$, $(N_nPr_2)_2Al(-N_iPr-(CH_2)_2-NEt_2)$, $(N_nPr_2)_2Al(-N_nPr-(CH_2)_2-NEt_2)$, $(N_nPr_2)_2Al(-N_iBu-(CH_2)_2-NEt_2)$, $(N_nPr_2)_2Al(-N_nBu-(CH_2)_2-NEt_2)$, $(N_nPr_2)_2Al(-N_tBu-(CH_2)_2-NEt_2)$, $(N_nPr_2)_2Al(-N_sBu-(CH_2)_2-NEt_2)$, $(N_iBu_2)_2Al(-NMe-(CH_2)_2-NEt_2)$, $(N_iBu_2)_2Al(-NEt-(CH_2)_2-NEt_2)$, $(N_iBu_2)_2Al(-N_iPr-(CH_2)_2-NEt_2)$, $(N_iBu_2)_2Al(-N_nPr-(CH_2)_2-NEt_2)$, $(N_iBu_2)_2Al(-N_iBu-(CH_2)_2-NEt_2)$, $(N_iBu_2)_2Al(-N_nBu-(CH_2)_2-NEt_2)$, $(N_iBu_2)_2Al(-N_tBu-(CH_2)_2-NEt_2)$, ($N_tBu_2)_2Al(-NMe-(CH_2)_2-NEt_2)$, ($N_tBu_2)_2Al(-NEt-(CH_2)_2-NEt_2)$, ($N_tBu_2)_2Al(-N_iPr-(CH_2)_2-NEt_2)$, ($N_tBu_2)_2Al(-N_nPr-(CH_2)_2-NEt_2)$, ($N_tBu_2)_2Al(-N_iBu-(CH_2)_2-NEt_2)$, ($N_tBu_2)_2Al(-N_nBu-(CH_2)_2-NEt_2)$, ($N_tBu_2)_2Al(-N_tBu-(CH_2)_2-NEt_2)$, ($N_tBu_2)_2Al(-N_sBu-(CH_2)_2-NEt_2)$, ($N_sBu_2)_2Al(-NMe-(CH_2)_2-NEt_2)$, ($N_sBu_2)_2Al(-NEt-(CH_2)_2-NEt_2)$, ($N_sBu_2)_2Al(-N_iPr-(CH_2)_2-NEt_2)$, ($N_sBu_2)_2Al(-N_nPr-(CH_2)_2-NEt_2)$, ($N_sBu_2)_2Al(-N_iBu-(CH_2)_2-NEt_2)$, ($N_sBu_2)_2Al(-N_nBu-(CH_2)_2-NEt_2)$, ($N_sBu_2)_2Al(-N_tBu-(CH_2)_2-NEt_2)$, or ($N_iBu_2)_2Al(-N_sBu-(CH_2)_2-NEt_2)$;

the composition comprising between approximately 95% by weight or w/w and approximately 100.0% w/w of the precursor;

the composition comprising between approximately 99% by weight or w/w and approximately 99.999% w/w of the precursor;

the composition comprising between approximately 99% by weight or w/w and approximately 100.0% w/w of the precursor;

the composition comprising between approximately 0.0% by weight or w/w and approximately 5.0% w/w impurities;

the composition comprising between approximately 0.0% by weight or w/w and approximately 0.1% w/w impurities; and the composition comprising between approximately 0 ppbw and approximately 500 ppbw metal impurities.

NOTATION AND NOMENCLATURE

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means ±10% of the value stated.

As used herein, "room temperature" in the text or in a claim means from approximately 20° C. to approximately 25° C.

The term "ambient temperature" refers to an environment temperature approximately 20° C. to approximately 25° C.

As used in the disclosed embodiments, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., $SiO_2$, SiN, SiON, SiCOH, etc.), metal containing layers (e.g., copper, cobalt, ruthenium, tungsten, platinum, palladium, nickel, ruthenium, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates.

The term "aspect ratio" refers to a ratio of the height of a trench (or aperture) to the width of the trench (or the diameter of the aperture).

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

The terms "via", "aperture" and "hole" are sometimes used interchangeably, and generally mean an opening in an interlayer insulator.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

The standard abbreviations of the elements from the periodic table of elements are used herein. It should be understood that elements may be referred to by these abbreviation (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

The term "wafer" or "patterned wafer" refers to a wafer having a stack of silicon-containing films on a substrate and a patterned hardmask layer on the stack of silicon-containing films formed for pattern etch. The term "wafer" or "patterned wafer" may also refers to a trench wafer having an aspect ratio.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "deposition temperature" and "substrate temperature" may be used interchangeably. It is understood that a substrate temperature may correspond to, or related to a deposition temperature, and that the deposition temperature may refer to the substrate temperature.

Note that herein, the terms "precursor" and "deposition compound" and "deposition gas" may be used interchangeably when the precursor is in a gaseous state at room temperature and ambient pressure. It is understood that a precursor may correspond to, or related to a deposition compound or deposition gas, and that the deposition compound or deposition gas may refer to the precursor.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

The standard abbreviations of the elements from the periodic table of elements are used herein. It should be understood that elements might be referred to by these abbreviation (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

As used in the disclosed embodiments, the term "hydrocarbyl group" refers to a functional group containing carbon and hydrogen; the term "alkyl group" refers to saturated functional groups containing exclusively carbon and hydrogen atoms. The hydrocarbyl group may be saturated or unsaturated. Either term refers to linear, branched, or cyclic groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used in the disclosed embodiments, the abbreviation "Me" refers to a methyl group; the abbreviation "Et" refers to an ethyl group; the abbreviation "Pr" refers to a propyl group.

Ranges may be expressed herein as from about one particular value, and/or to about another particular value. When such a range is expressed, it is to be understood that another embodiment is from the one particular value and/or to the other particular value, along with all combinations within said range. Any and all ranges recited herein are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
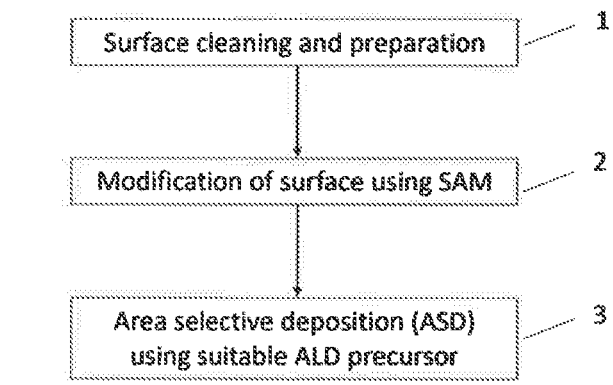
FIG. 1 is a flowchart of an exemplary of ASD process.

Disclosed are metal-containing film forming compositions comprising a metal-containing precursor containing aminoamide ligands, methods of using the same to deposit metal-containing films for manufacturing semiconductor devices. More specifically, the disclosed are processes of area selective deposition (ASD) of the metal-containing precursor containing the aminoamide ligands to form the metal-containing films. The aminoamide ligands that provide a coordinate bond to the metal center may reduce oxophilic characters of the metal center and limit accessibility of the precursor to oxygen in an inhibitor by steric effect. The disclosed precursors are new designs of precursors containing Group 12, Group 13, Group 14, Group 15, Group IV or Group V elements having heteroleptic ligands, one of which is a multidentate ligand. The disclosed methods are able to fine tune selective depositions under mild process conditions, such as deposition temperatures ranging from room temperature to approximately 500° C. Furthermore, the disclosed ASD are highly selective depositions of Group 12, Group 13, Group 14, Group 15, Group IV or Group V element containing thin films on dielectric or metal substrates.

The disclosed precursors are capable of selective deposition of metal oxide films even though an O-containing inhibitor, such as O-binded self-assembled monolayers (SAM), is used.

The disclosed aminoamide ligands have a general formula:

$$-N(R)-(CR'_2)_n-NR''_2 \quad (I)$$

wherein R, R" each are independently a $C_1$-$C_{10}$ linear, branched or cyclic alkyl, alkenyl, or trialkylsilyl group; R' is H or a $C_1$-$C_{10}$ linear, branched or cyclic alkyl, alkenyl or trialkylsilyl group; n=1-4. Preferably n=2 or 3, R=Me, Et, Pr, Bu, and R"=Me, Et.

The disclosed aminoamide ligands may form the metal-containing precursors for depositing metal-containing films with ASD process having the following formula:

$$L_xM(-N(R)-(CR'_2)_n-NR''_2) \quad (II)$$

wherein M is a Group 12, Group 13, Group 14, Group 15, Group IV or Group V metal; x+1 is the oxidation state of M; L is an anionic ligand, independently selected from dialkylamine, alkoxy, alkylimine, bis(trialkylsilylamine), amidinate, betadiketonate, keto-imine, halide, etc.; R, R" each are independently a $C_1$-$C_{10}$ linear, branched or cyclic alkyl, alkenyl, or trialkylsilyl group; R' is H or a $C_1$-$C_{10}$ linear, branched or cyclic alkyl, alkenyl or trialkylsilyl group; n=1-4. Preferably, M=Al; x=2; L is a dialkylamino ligand $-NR^1R^2$ wherein $R^1$, $R^2$ each independently are a linear or branched alkyl group having 1 to 5 carbon atoms, preferably $R^1$=$R^2$=Me; n=2; R=Me, Et, Pr, Bu; R'=H; R"=Me, Et.

Exemplary Al-containing precursors include (NMe$_2$)$_2$Al(—NMe-(CH$_2$)$_2$—NMe$_2$), (NMe$_2$)$_2$Al(—NEt-(CH$_2$)$_2$—NMe$_2$), (NMe$_2$)$_2$Al(—N$_i$Pr—(CH$_2$)$_2$—NMe$_2$), (NMe$_2$)$_2$Al(—N$_n$Pr—(CH$_2$)$_2$—NMe$_2$), (NMe$_2$)$_2$Al(—N$_s$Bu-(CH$_2$)$_2$—NMe$_2$), (NMe$_2$)$_2$Al(—N$_n$Bu-(CH$_2$)$_2$—NMe$_2$), (NMe$_2$)$_2$Al(—N$_t$Bu-(CH$_2$)$_2$—NMe$_2$), (NMe$_2$)$_2$Al(—N$_s$Bu-(CH$_2$)$_2$—NMe$_2$), (NEt$_2$)$_2$Al(—NMe-(CH$_2$)$_2$—NMe$_2$), (NEt$_2$)$_2$Al(—NEt-(CH$_2$)$_2$—NMe$_2$), (NEt$_2$)$_2$Al(—N$_i$Pr—(CH$_2$)$_2$—NMe$_2$), (NEt$_2$)$_2$Al(—N$_n$Pr—(CH$_2$)$_2$—NMe$_2$), (NEt$_2$)$_2$Al(—N$_t$Bu-(CH$_2$)$_2$—NMe$_2$), (NEt$_2$)$_2$Al(—N$_n$Bu-(CH$_2$)$_2$—NMe$_2$), (NEt$_2$)$_2$Al(—N$_i$Bu-(CH$_2$)$_2$—NMe$_2$), (NEt$_2$)$_2$Al(—N$_s$Bu-(CH$_2$)$_2$—NMe$_2$), (N$_i$Pr$_2$)$_2$Al(—NMe-(CH$_2$)$_2$—NMe$_2$), (N$_i$Pr$_2$)$_2$Al(—NEt-(CH$_2$)$_2$—NMe$_2$), (N$_i$Pr$_2$)$_2$Al(—N$_i$Pr—(CH$_2$)$_2$—NMe$_2$), (N$_i$Pr$_2$)$_2$Al(—N$_n$Pr—(CH$_2$)$_2$—NMe$_2$), (N$_i$Pr$_2$)$_2$Al(—N$_t$Bu-(CH$_2$)$_2$—NMe$_2$), (N$_i$Pr$_2$)$_2$Al(—N$_n$Bu-(CH$_2$)$_2$—NMe$_2$), (N$_i$Pr$_2$)$_2$Al(—N$_t$Bu-(CH$_2$)$_2$—NMe$_2$), (N$_i$Pr$_2$)$_2$Al(—N$_i$Bu-(CH$_2$)$_2$—NMe$_2$), (N$_n$Pr$_2$)$_2$Al(—NMe-(CH$_2$)$_2$—NMe$_2$), (N$_n$Pr$_2$)$_2$Al(—NEt-(CH$_2$)$_2$—NMe$_2$), (N$_n$Pr$_2$)$_2$Al(—N$_i$Pr—(CH$_2$)$_2$—NMe$_2$), (N$_n$Pr$_2$)$_2$Al(—N$_n$Pr—(CH$_2$)$_2$—NMe$_2$), (N$_n$Pr$_2$)$_2$Al(—N$_i$Bu-(CH$_2$)$_2$—NMe$_2$), (N$_n$Pr$_2$)$_2$Al(—N$_n$Bu-(CH$_2$)$_2$—NMe$_2$), (N$_n$Pr$_2$)$_2$Al(—N$_t$Bu-(CH$_2$)$_2$—NMe$_2$), (N$_n$Pr$_2$)$_2$Al(—N$_s$Bu-(CH$_2$)$_2$—NMe$_2$), (N$_n$Bu$_2$)$_2$Al(—NMe-(CH$_2$)$_2$—NMe$_2$), (N$_n$Bu$_2$)$_2$Al(—NEt-(CH$_2$)$_2$—NMe$_2$), (N$_n$Bu$_2$)$_2$Al(—N$_i$Pr—(CH$_2$)$_2$—NMe$_2$), (N$_n$Bu$_2$)$_2$Al(—N$_n$Pr—(CH$_2$)$_2$—NMe$_2$), (N$_n$Bu$_2$)$_2$Al(—N$_i$Bu-(CH$_2$)$_2$—NMe$_2$), (N$_n$Bu$_2$)$_2$Al(—N$_n$Bu-(CH$_2$)$_2$—NMe$_2$), (N$_n$Bu$_2$)$_2$Al(—N$_t$Bu-(CH$_2$)$_2$—NMe$_2$), (N$_n$Bu$_2$)$_2$Al(—N$_s$Bu-(CH$_2$)$_2$—NMe$_2$), (N$_i$Bu$_2$)$_2$Al(—NMe-(CH$_2$)$_2$—NMe$_2$), (N$_i$Bu$_2$)$_2$Al(—NEt-(CH$_2$)$_2$—NMe$_2$), (N$_i$Bu$_2$)$_2$Al(—N$_i$Pr—(CH$_2$)$_2$—NMe$_2$), (N$_i$Bu$_2$)$_2$Al(—N$_n$Pr—(CH$_2$)$_2$—NMe$_2$), (N$_i$Bu$_2$)$_2$Al(—N$_i$Bu-(CH$_2$)$_2$—NMe$_2$), (N$_i$Bu$_2$)$_2$Al(—N$_n$Bu-(CH$_2$)$_2$—NMe$_2$), (N$_i$Bu$_2$)$_2$Al(—N$_t$Bu-(CH$_2$)$_2$—NMe$_2$), (N$_i$Bu$_2$)$_2$Al(—N$_s$Bu-(CH$_2$)$_2$—NMe$_2$), (N$_t$Bu$_2$)$_2$Al(—NMe-(CH$_2$)$_2$—NMe$_2$), (N$_t$Bu$_2$)$_2$Al(—NEt-(CH$_2$)$_2$—NMe$_2$), (N$_t$Bu$_2$)$_2$Al(—N$_i$Pr—(CH$_2$)$_2$—NMe$_2$), (N$_t$Bu$_2$)$_2$Al(—N$_n$Pr—(CH$_2$)$_2$—NMe$_2$), (N$_t$Bu$_2$)$_2$Al(—N$_i$Bu-(CH$_2$)$_2$—NMe$_2$), (N$_t$Bu$_2$)$_2$Al(—N$_n$Bu-(CH$_2$)$_2$—NMe$_2$), (N$_t$Bu$_2$)$_2$Al(—N$_t$Bu-(CH$_2$)$_2$—NMe$_2$), (N$_t$Bu$_2$)$_2$Al(—N$_s$Bu-(CH$_2$)$_2$—NMe$_2$), (N$_s$Bu$_2$)$_2$Al(—NMe-(CH$_2$)$_2$—NMe$_2$), (N$_s$Bu$_2$)$_2$Al(—NEt-(CH$_2$)$_2$—NMe$_2$), (N$_s$Bu$_2$)$_2$Al(—N$_i$Pr—(CH$_2$)$_2$—NMe$_2$), (N$_s$Bu$_2$)$_2$Al(—N$_n$Pr—(CH$_2$)$_2$—NMe$_2$), (N$_s$Bu$_2$)$_2$Al(—N$_i$Bu-(CH$_2$)$_2$—NMe$_2$), (N$_i$Bu$_2$)$_2$Al(—N$_i$Bu-(CH$_2$)$_2$—NMe$_2$), (N$_s$Bu$_2$)$_2$Al(—N$_s$Bu-(CH$_2$)$_2$—NMe$_2$), (NMe$_2$)$_2$Al(—NMe-(CH$_2$)$_2$—NEt$_2$), (NMe$_2$)$_2$Al(—NEt-(CH$_2$)$_2$—NEt$_2$), (NMe$_2$)$_2$Al(—N$_i$Pr—(CH$_2$)$_2$—NEt$_2$), (NMe$_2$)$_2$Al(—N$_n$Pr—(CH$_2$)$_2$—NEt$_2$), (NMe$_2$)$_2$Al(—N$_1$Bu-(CH$_2$)$_2$—NEt$_2$), (NMe$_2$)$_2$Al(—N$_n$Bu-(CH$_2$)$_2$—NEt$_2$), (NMe$_2$)$_2$Al(—N$_t$Bu-(CH$_2$)$_2$—NEt$_2$), (NMe$_2$)$_2$Al(—N$_s$Bu-(CH$_2$)$_2$—NEt$_2$), (NEt$_2$)$_2$Al(—NMe-(CH$_2$)$_2$—NEt$_2$), (NEt$_2$)$_2$Al(—NEt-(CH$_2$)$_2$—NEt$_2$), (NEt$_2$)$_2$Al(—N$_i$Pr—(CH$_2$)$_2$—NEt$_2$), (NEt$_2$)$_2$Al(—N$_n$Pr—(CH$_2$)$_2$—NEt$_2$), (NEt$_2$)$_2$Al(—N$_i$Bu-(CH$_2$)$_2$—NEt$_2$), (NEt$_2$)$_2$Al(—N$_n$Bu-(CH$_2$)$_2$—NEt$_2$), (NEt$_2$)$_2$Al(—N$_t$Bu-(CH$_2$)$_2$—NEt$_2$), (N$_i$Pr$_2$)$_2$Al(—NMe-(CH$_2$)$_2$—NEt$_2$), (N$_i$Pr$_2$)$_2$Al(—NEt-(CH$_2$)$_2$—NEt$_2$), (N$_i$Pr$_2$)$_2$Al(—N$_i$Pr(CH$_2$)$_2$—NEt$_2$), (N$_i$Pr$_2$)$_2$Al(—N$_n$Pr—(CH$_2$)$_2$—NEt$_2$), (N$_i$Pr$_2$)$_2$Al(—N$_s$Bu-(CH$_2$)$_2$—NEt$_2$), (N$_i$Pr$_2$)$_2$Al(—N$_n$Bu-(CH$_2$)$_2$—NEt$_2$), (N$_i$Pr$_2$)$_2$Al(—N$_t$Bu-(CH$_2$)$_2$—NEt$_2$), (N$_i$Pr$_2$)$_2$Al(—N$_i$Bu-(CH$_2$)$_2$—NEt$_2$), (N$_s$Bu$_2$)$_2$Al(—NMe-(CH$_2$)$_2$—NEt$_2$), (N$_s$Bu$_2$)$_2$Al(—NEt-(CH$_2$)$_2$—NEt$_2$), (N$_s$Bu$_2$)$_2$Al(—N$_i$Pr—(CH$_2$)$_2$—NEt$_2$), (N$_s$Bu$_2$)$_2$Al(—N$_n$Pr—(CH$_2$)$_2$—NEt$_2$), (N$_s$Bu$_2$)$_2$Al(—N$_i$Bu-(CH$_2$)$_2$—NEt$_2$), (N$_s$Bu$_2$)$_2$Al(—N$_n$Bu-(CH$_2$)$_2$—NEt$_2$), (N$_s$Bu$_2$)$_2$Al(—N$_t$Bu-(CH$_2$)$_2$—NEt$_2$), and (N$_s$Bu$_2$)$_2$Al(—N$_s$Bu- (CH$_2$)$_2$—NEt$_2$).

Other exemplary metal containing precursors may be listed by replacing Al in the above molecules with B, Ga, In, lanthanide elements, P, As, Sb or Bi.

One preferred metal-containing precursor is (NMe$_2$)$_2$Al(—NEt-(CH$_2$)$_2$—NEt$_2$) having the structure:

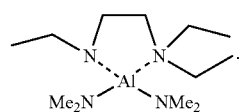

The disclosed metal-containing precursors contain heteroleptic ligands with one of which is a multidentate ligand. The disclosed metal-containing precursors offer unique area selectivity on various substrates.

The disclosed metal-containing precursors containing Group 12 metal have a general formula:

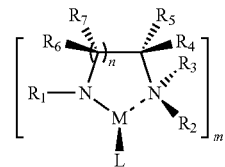

where M=Zn, L is independently selected from H, a linear or branched alkyl group, an alkoxy —OR group with R being H, an alkyl group, a —NR$_a$R$_b$ group with R$_a$, R$_b$ being independently H, a C$_1$-C$_5$ linear or branched alkyl group, or a SiR'$_3$ group with each R' being independently H or an alkyl group; R$_1$ to R$_7$ are independently selected from H or a C$_1$-C$_5$ linear or branched alkyl group; n>0 integer, 0<m<6 integer.

The disclosed metal-containing precursors containing Group 13 and Group 15 metal have a general formula:

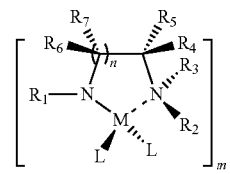

where M is B, Al, Ga, In, Tl, P, As, Sb or Bi; L is independently selected from H, a $C_1$-$C_5$ linear or branched alkyl group, an alkoxy —OR group with R being H, an alkyl group, a —$NR_aR_b$ group with $R_a$, $R_b$ being independently H, a $C_1$-$C_5$ linear or branched alkyl group, or a $SiR'_3$ group with each R' being independently H or an alkyl group; $R_1$ to $R_7$ are independently selected from H or a $C_1$-$C_5$ linear or branched alkyl group; n>0 integer, 0<m<6 integer.

The disclosed metal-containing precursors containing Group IV and Group 14 metal have a general formula:

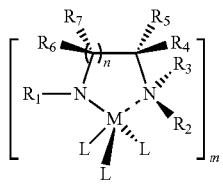

where M is Ti, Zr, Hf, Si, Ge, Sn or Pb; L is independently selected from H, a $C_1$-$C_5$ linear or branched alkyl group, an alkoxy —OR group with R being H, an alkyl group, a —$NR_aR_b$ group with $R_a$, $R_b$ being independently H, a $C_1$-$C_5$ linear or branched alkyl group, or a $SiR'_3$ group with each R' being independently H or an alkyl group; $R_1$ to $R_7$ are independently selected from H or a $C_1$-$C_5$ linear or branched alkyl group; n>0 integer, 0<m<6 integer.

The disclosed metal-containing precursors containing Group V metal have a general formula:

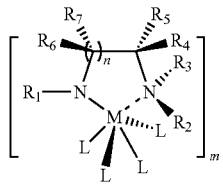

where M is V, Nb, Ta; L is independently selected from H, a $C_1$-$C_5$ linear or branched alkyl group, an alkoxy —OR group with R being H, an alkyl group, a —$NR_aR_b$ group with $R_a$, $R_b$ being independently H, a $C_1$-$C_5$ linear or branched alkyl group, or a $SiR'_3$ group with each R' being independently H or an alkyl group; $R_1$ to $R_7$ are independently selected from H or a $C_1$-$C_5$ linear or branched alkyl group; n>0 integer, 0<m<6 integer.

Preferably, the disclosed metal-containing precursors have suitable properties for ASD of metal-containing films. FIG. 1 depicts a flowchart of an exemplary of an ASD process. The process is started with a surface cleaning and preparation step (Step 1) for a substrate to be used. A wafer or substrate used for deposition of a metal containing film has at least two different surfaces exposed simutaneously. For example, the wafer or substrate has at least one first surface being a metal surface, such as a W (tungsten) surface, and at least one second surface being a dielectric surface, such as a $SiO_2$ surface. In this step, the wafer or substrate is cleaned to remove native oxides or residues. For example, the wafer or substrate is cleaned to remove the native oxides or residues with a diluted HF (1%) for about 1 min and then rinsed with deionized water. One of the ordinary skilled in the art will recognize that any solvents or solutions used to clean and remove chemicals may be used here to clean the wafer or substrate. After that, $N_2$ gas is blown onto the wafer or substrate to dry the wafer.

Next step, Step 2, is the step of SAM modification or SAM pre-treatment of the wafer or substrate depending on which surface a desired metal-containing film being deposited. If a metal-containing film is to be deposited on the metal surface, a dielectric blocking SAM layer is formed using a dielectric blocking agent to modify the dielectric surface for preventing the metal-containing film from being deposited on it. If a metal-containing film is to be deposited on the dielectric surface, a metal blocking SAM layer is formed using a metallic blocking agent to modify the metal surface for preventing the metal-containing film from being deposited on it. For the SAM layer formation, the cleaned and dried wafer or substrate is immersed or dipped in a neat SAM solution for about 24 hours and then rinsed with acetone, IPA and deionized water. After that, $N_2$ gas is blown onto the wafer or substrate to dry the wafer. Then, the wafer or substrate is dried under vacuum for about 4 hours. Alternatively, instead of dipping the wafer into the neat SAM agent, the SAM layer formed on the wafer or substrate may be formed by vapor spray of the neat chemical solution thereon, and then dried by blowing dry $N_2$. By this step, a SAM layer is grown on either the dielectric surface or the metal surface depending on which type of the SAM solution is selected. If the SAM solution is a metal blocking agent, the SAM layer will grow on the metal surface. If the SAM solution is a dielectric blocking agent, the SAM layer will grow on the dielectric surface.

The dielectric blocking agent for blocking the dielectric surface include, but are not limited to, compounds having a formula $R_{4-a}SiX_a$, wherein each X are independently a surface hydroxyl reactive group (halide, alkylamino, alkoxy, acetamide, etc.), and each R are selected from H, a $C_1$-$C_2$ alkyl or fluoroalkyl group or mixture thereof. Examples of the dielectric blocking agent include dimethyldichlorosilane (DMDCS); tricholorosilane derivatives, $X(CH_2)_nSiCl_3$, wherein X=$CH_3$, Br, CN; n=7-17, such as n-octadecyltrichlorosilane (OTS, $CH_3(CH_2)_{17}SiCl_3$), octadecylsiloxanes (ODS), tridecafluoro-1,1,2,2-tetrahydrooctyltrichlorosilane (FOTS), alkyltricholorosilanes ($CH_3(CH_2)_nSiCl_3$), bromoundecyltricholorsilane ($Br(CH_2)_{11}SiCl_3$), cyanoundecylcholorosilane ($CN(CH_2)_{11}SiCl_3$); phenyl- and pentafluorophenyl-based silanes; octadecylsiloxanes (ODS), or the like.

The metallic blocking agent is typically an alkyl or fluoroalkyl compound having a surface reactive chemical function group selected from phosphonic acids, carboxylic acids, thiols, or triazoles.

If a dielectric blocking agent is applied, the SAM layer will grown on the dielectric $SiO_2$ surface due to —OH hydroxyl-termination groups on the $SiO_2$ surface, whereas, the metal surface will have no SAM grown thereon. The SAM formed on the dielectric $SiO_2$ surface would protect the dielectric $SiO_2$ surface from an ALD of a metal-containing film as shown in the next step.

The third step (Step 3) of the ASD process is an ALD process, which is an area-selective ALD. The substrate pre-treated by the dielectric blocking agent in Step 2 is placed into an ALD processing chamber for ALD of a metal-containing film using the disclosed metal-containing precursor. The metal-containing film is selectively deposited on the metal surface over the dielectric $SiO_2$ surface. Conversely, the ALD of the metal-containing films may be selectively deposited on the dielectric surfaces by blocking the metal surfaces, such as Cu, Co, Ru, Pt, etc., using the metal blocking agent to form a metal blocking SAM layer on the surface. One of ordinary skilled in the art will recognize that the substrate may have a plurality of the first and second surfaces where the first surfaces are selectively deposited with the metal-containing films by blocking the second surfaces after the SAM pre-treatment on the substrate. One of ordinary skilled in the art will also recognize that more than one SAM pre-treated substrates may be applied for the ASD in the ALD processing chamber, each pre-treated substrate contains at least two different surfaces and one surface is selectively deposited with the metal-containing film over the other surface.

The disclosed metal-containing precursors may be suitable for the deposition of metal-containing films, such as $Al_2O_3$, by ASD processes and have the following advantages:

a. liquid at room temperature or having a melting point lower than 50° C.;
b. thermally stable to enable proper distribution and evaporation using industry standard methods (bubbler, direct liquid injection, vapor draw) without particle generation and product decomposition;
c. suitable reactivity with the substrate to permit a wide self-limited ALD window, allowing deposition of a variety of Metal-containing films, such as $Ai_2O_3$, NbN, $Nb_2O_5$, etc.;
d. suitable reactivity of the chemisorbed precursor with a co-reactant to form a metal-containing film in an ALD process; and
e. high thermal stability of the chemisorbed species to prevent self-decomposition and parasitic CVD growth on the surface of the substrate.

While the disclosed metal-containing precursors are ideally liquids and vaporized in bubblers or direct liquid injection systems, the use of solid precursors for ALD precursor vaporization is also possible using sublimators such as ones disclosed in PCT Publication WO2009/087609 to Xu et al. Alternatively, solid precursors may be mixed or dissolved in a solvent to reach a usable melting point and viscosity for usage by Direct Liquid Injection systems.

To ensure process reliability, the disclosed metal-containing precursors may be purified by continuous or fractional batch distillation or sublimation prior to use to a purity ranging from approximately 95% by weight or w/w to approximately 100% w/w, preferably ranging from approximately 99% w/w to approximately 99.999% w/w, more preferably, ranging from approximately 99% w/w to approximately 100% w/w.

The disclosed metal-containing precursors may contain any of the following impurities: undesired congeneric species; solvents; chlorinated metal compounds; or other reaction products. In one alternative, the total quantity of these impurities is below 5.0% w/w, preferably, below 0.1% w/w.

Solvents, such as hexane, pentane, dimethyl ether, or anisole, may be used in the precursor's synthesis. The concentration of the solvent in the disclosed Metal-containing precursors may range from approximately 0% w/w to approximately 5% w/w, preferably from approximately 0% w/w to approximately 0.1% w/w. Separation of the solvents from the precursor may be difficult if both have similar boiling points. Cooling the mixture may produce solid precursor in liquid solvent, which may be separated by filtration. Vacuum distillation may also be used, provided the precursor product is not heated above approximately its decomposition point.

In one alternative, the disclosed Metal-containing precursors contain less than 5% v/v, preferably less than 1% v/v, more preferably less than 0.1% v/v, and even more preferably less than 0.01% v/v of any of its undesired congeneric species, reactants, or other reaction products. This alternative may provide better process repeatability. This alternative may be produced by distillation of the disclosed Metal-containing precursors.

In another alternative, the disclosed metal-containing precursors may contain between 5% v/v and 50% v/v of one or more of congeneric metal-containing precursors, reactants, or other reaction products, particularly when the mixture provides improved process parameters or isolation of the target compound is too difficult or expensive. For example, a mixture of two Metal-containing precursors may produce a stable, liquid mixture suitable for vapor deposition.

In another alternative, the disclosed metal-containing precursors may contain between approximately 0 ppbw and approximately 500 ppbw metal impurities.

The concentration of trace metals and metalloids in the disclosed metal-containing precursors may each range from approximately 0 ppb to approximately 100 ppb, and more preferably from approximately 0 ppb to approximately 10 ppb.

In addition to the disclosed Metal-containing precursors, a reactant or a co-reactant may also be introduced into the reactor. The co-reactant may be an oxygen-containing gas or a nitrogen-containing gas for metal oxide film deposition. The co-reactants include, but are not limited to, oxidizers such as, $O_3$, $O_2$, $H_2O$, $H_2O_2$, $D_2O$, ROH ($R=C_1-C_{10}$ linear or branched hydrocarbon), etc. $H_2O$ and ROH ($R=C_1-C_{10}$ linear or branched hydrocarbon) are preferred oxidation sources to avoid reacting with the SAM layer formed on the substrates.

The ALD sequence may include sequential pulses of several compounds. For instance, the surface may be exposed to $O_2/O_3$ followed by $H_2O$ in order to increase the density of hydroxyl groups on the surface.

Alternatively, the co-reactant may be a nitrogen-containing gas for Nnitrogen-contiaiing film deposition. The nitrogen-containing gas includes, but is not limited to, $NH_3$, NO, $N_2O$, hydrazines, primary amines such as methylamine, ethylamine, tertbutylamine; secondary amines such as dimethylamine, diethylamine, di-isoprpylamine, ethylmethylamine, pyrrolidine; tertiary amines such as trimethylamine, triethylamine, trisilylamine, $N_2$, $N_2/H_2$ mixture thereof, preferably $NH_3$. The co-reactant may be selected from $NH_3$, NO, $N_2O$, hydrazines, amines or combinations thereof. Preferably, plasma-treated co-reactants are avoided as they tend to damage the SAM layer, unless the SAM layer is re-formed at each ALD cycle.

Also disclosed are methods or processes for forming metal-containing films on a substrate using an ASD process. In one embodiment, the method for forming a metal-containing film on a substrate comprises the steps of a) providing the substrate having a first surface and a second surface, b) exposing the substrate to a SAM solution or precursor to form a SAM layer on the second surface, c) exposing the substrate to a vapor including a disclosed metal-containing film-forming composition that contains a disclosed precursor, d) selectively depositing at least part of the deposition precursor onto the first surface (i.e. depostion on the first surface is selective for the first surface over the second surface) to form a metal containing film through a vapor deposition process, and repeating c) and d) until a desired thickness of the metal-containing film is formed. The method further comprises the step of exposing the substrate to a co-reactant following c), wherein the co-reactant is selected from $O_3$, $O_2$, $H_2O$, $H_2O_2$, $D_2O$, ROH ($R=C_1-C_{10}$ (linear or branched)) hydrocarbon, $NH_3$, NO, $N_2O$, hydrazines, amines or combinations thereof. For example, one or a combination of the above co-reactants may be used for deposition of silicon oxynitride films, either by co-flowing the co-reactant, or sequentially. In an alternative embodiment, the method for forming a metal-containing film on a substrate comprises the steps of a) providing a surface having a plurality of materials exposed thereon simultaneously, b) exposing the surface to a vapor of a disclosed metal-containing film-forming composition that contains the disclosed precursor as shown on Formula (II), and c) preferentially or selectively depositing a film on one or more of, but less than all of, the plurality of materials on the surface in a vapor deposition process, wherein at least one of the materials on the surface is at least partially blocked by a blocking agent thereby reducing or preventing a deposition of the metal-containing film on said blocked material.

The method further comprises the step of exposing the substrate to a co-reactant following the step b), wherein the co-reactant is selected from $O_3$, $O_2$, $H_2O$, $H_2O_2$, $D_2O$, ROH ($R=C_1-C_{10}$ (linear or branched)) hydrocarbon, $NH_3$, NO, $N_2O$, hydrazines, -amines or combinations thereof. The method further comprises the steps of repeating the exposing to the vapor of the metal-containing film-forming composition and the exposing to the co-reactant until a desired thickness of the metal-containing film is formed, and purging excess vapor of the metal-containing film-forming composition and excess co-reactant using an inert gas, respectively, to separate each exposure, wherein the inert gas is $N_2$, Ar, Kr or Xe.

The disclosed processes using the disclosed metal-containing precursors include ALD processes for selective deposition of metal-containing films. Suitable ALD methods include thermal ALD, spatial ALD and temporal ALD methods. Preferably the suitable ALD methods do not use a plasma, as it is extremely difficult to grow conformal films in high aspect ratio with this type of ALD. It is understood that the suitable ALD may operate in a non-perfect self-limited growth regime, allowing some parasitic CVD to happen. Such parasitic CVD may not be a problem as long as the deposited film meets conformity requirements.

The reaction chamber may be any enclosure or chamber of a device in which deposition methods take place, such as, without limitation, a parallel-plate type reactor, a hot-wall type reactor, a single-wafer reactor, a multi-wafer reactor, or other such types of deposition systems. All of these exemplary reaction chambers are capable of serving as an ALD reaction chamber.

The reactor contains one or more substrates onto which the thin films will be selectively deposited. A substrate is generally defined as the material on which a process is conducted. The substrates are cleaned to remove native oxides and dried before SAM pre-treatment. The substrates may be any suitable substrate used in semiconductor, photovoltaic, flat panel, or LCD-TFT device manufacturing. Examples of suitable substrates include wafers, such as metal (e.g., W, Ge, etc.), silicon, SiGe, silica, or glass. The substrate may also have one or more surface areas of differing materials already deposited upon it from a previous manufacturing step. For example, the wafers may include dielectric surfaces and conductive or electrode surfaces exposed simultaneously, such as, metal surfaces, metal oxide surfaces, silicon surfaces, silicon layers (crystalline, amorphous, porous, etc.), silicon oxide layers/surfaces, silicon nitride layers/surfaces, silicon oxy nitride layers/surfaces, carbon doped silicon oxide (SiCOH) layers/surfaces, or combinations thereof. Additionally, the wafers may include copper, cobalt, ruthenium, tungsten and/or other metal layers (e.g., platinum, palladium, nickel, ruthenium, or gold). The wafers may include barrier layers or electrodes, such as tantalum, tantalum nitride, etc. The wafers may be planar or patterned. The substrate may include layers of oxides which have the oxide surface exposed and are used as dielectric materials in 3D NAND, MIM, DRAM, or FeRam technologies (for example, $ZrO_2$ based materials, $HfO_2$ based materials, $TiO_2$ based materials, rare earth oxide based materials, ternary oxide based materials, etc.) or from nitride-based films (for example, TaN, TiN, NbN) that are used as electrodes. The disclosed processes may selectively deposit the metal-containing layer directly on the wafer or directly on one or more than one (when patterned layers form the substrate) of the layers on top of the wafer. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers/surfaces thereon are referred to as substrates. The actual substrate utilized may also depend upon the specific precursor embodiment utilized.

The disclosed ASD processes using the disclosed metal-containing precursors may be performed for substrates having a temperature range from room temperature to approximately 500° C. The ASD processing temperature ranges from room temperature to approximately 500° C., which is typically lower than the temperature of a self-decomposition temperature of the SAM.

The substrate exposure time in the ALD reaction chamber in the disclosed ASD processes using the disclosed precursors may range from 1 millisecond to 5 minutes, preferably from 1 second to 60 seconds. The co-reactant exposure time in the ALD reaction chamber in the disclosed ALD processes may range from 1 millisecond to 1 minute, preferably from 100 milliseconds to 30 seconds.

The pressure within the reaction chamber are held at conditions suitable for the precursor to react with the surface. For instance, the pressure in the chamber may be held between approximately 0.1 mTorr and approximately 1000 Torr, preferably between approximately 1 mTorr and approximately 400 Torr, more preferably between approximately 1 Torr and approximately 100 Torr, even more preferably between approximately 1 Torr and approximately 10 Torr.

The temperature of the reactor chamber may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from room temperature to approximately 600° C., Preferably from room temperature to approximately 500° C.

The disclosed ALD process or sequence typically includes steps to remove excess precursor and excess co-reactant from the deposition surface by providing a purge step, either by purging a reactor with an inert gas, or passing the substrate in a sector under high vacuum and/or a carrier gas curtain. The inert gas is $N_2$, Ne, Ar, Kr, or Xe, preferably, $N_2$ or Ar.

The disclosed metal-containing precursors and the co-reactants may be introduced into the reactor sequentially (ALD). The reactor may be purged with an inert gas between the introduction of the precursor and the introduction of the co-reactant and after the introduction of the co-reactant. Alternatively, the substrate can be moved from one area for precursor exposure to another area for co-reactant exposure (spatial ALD).

Depending-on the particular process parameters, deposition may take place for a varying length of time. Generally, deposition may be allowed to continue as long as desired or necessary to produce a film with the necessary thickness. Typical film thicknesses may vary from an atomic monolayer to several hundreds of microns, depending on the specific deposition process, preferably between 0.5 and 100 nm, more preferably between 1 and 50 nm. The deposition process may also be performed as many times as necessary to obtain the desired film.

In one non-limiting exemplary ASD type process, the vapor phase of the disclosed metal-containing precursor is introduced into the reactor, where the metal-containing precursor selectively physi- or chemisorbs on a SAM pretreated substrate. Excess composition may then be removed from the reactor by purging and/or evacuating the reactor. A desired gas (for example, $H_2O$ or $O_3$) is introduced into the reactor where it selectively reacts with the physi- or chemisorbed precursor in a self-limiting manner. Any excess reducing gas is removed from the reactor by purging and/or evacuating the reactor. If the desired film is a metal-containing film, this four-step process may provide the desired film thickness or may be repeated until a film having the necessary thickness has been obtained.

EXAMPLES

The following non-limiting examples are provided to further illustrate embodiments of the invention. However, the examples are not intended to be all inclusive and are not intended to limit the scope of the inventions described herein.

Example 1

Figure 2:
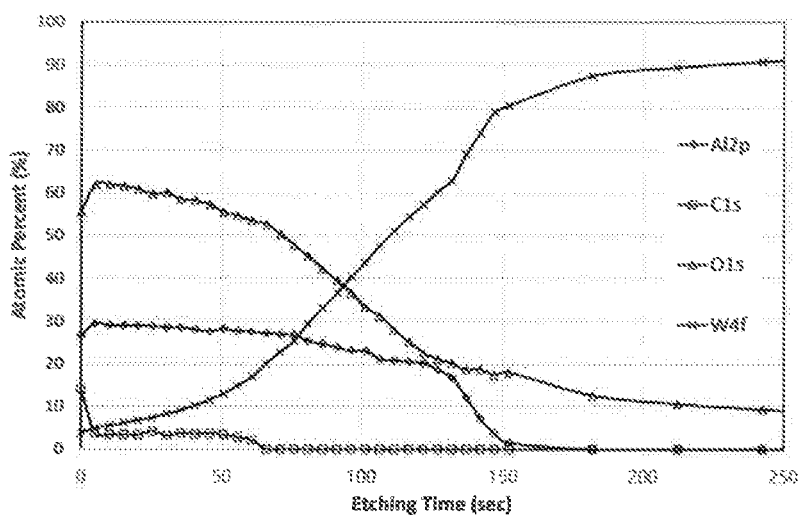
FIG. 2 is X-ray photon spectroscopy (XPS) results after ASD of $Al_2O_3$ film on the W wafer using $(NMe_2)_2Al(-NEt-(CH_2)_2-NEt_2)$ at 150° C.
Figure 3:
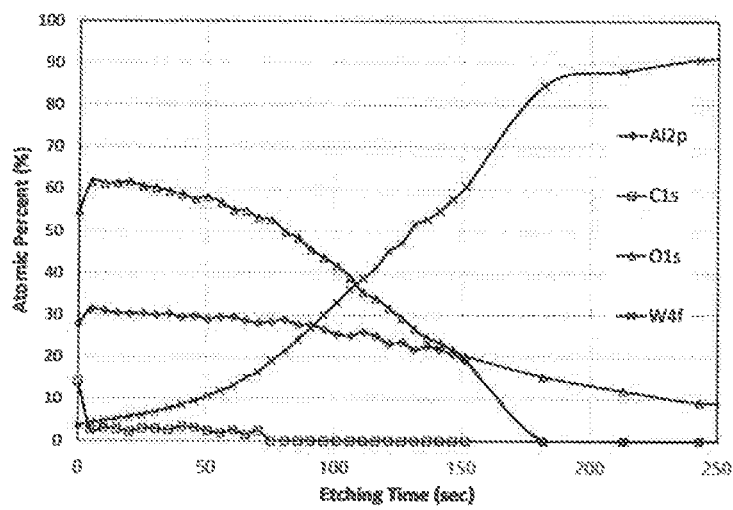
FIG. 3 is XPS results after ASD of $Al_2O_3$ film on the W wafer using $(NMe_2)_2Al(-NEt-(CH_2)_2-NEt_2)$ at 200° C.
Figure 4:
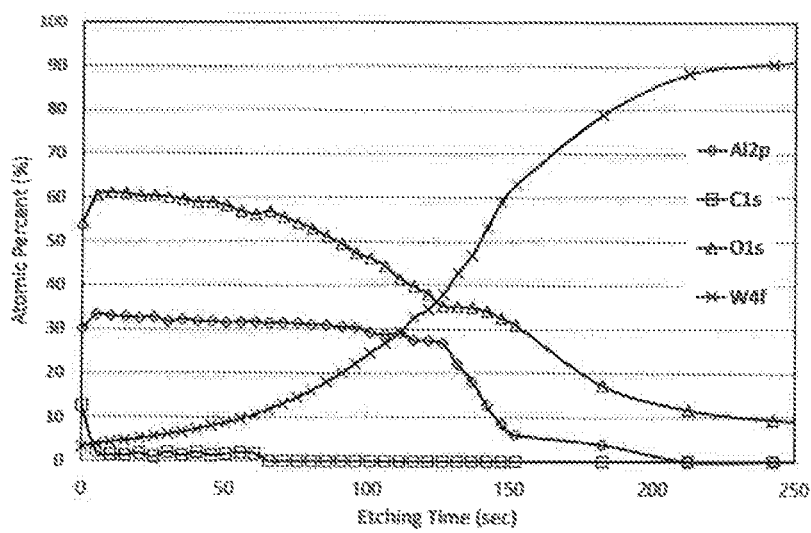
FIG. 4 is XPS results after ASD of A2O3 film on the W wafer using $(NMe_2)_2Al(-NEt-(CH_2)_2-NEt_2)$ at 250° C.
Figure 5:
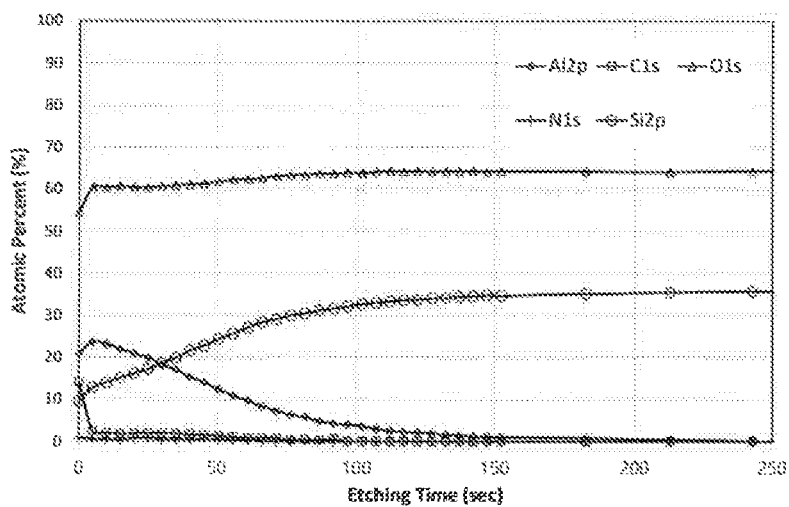
FIG. 5 is XPS results after ASD of $Al_2O_3$ film on the $SiO_2$ wafer using $(NMe_2)_2Al(-NEt-(CH_2)_2-NEt_2)$ at 150° C.
Figure 6:
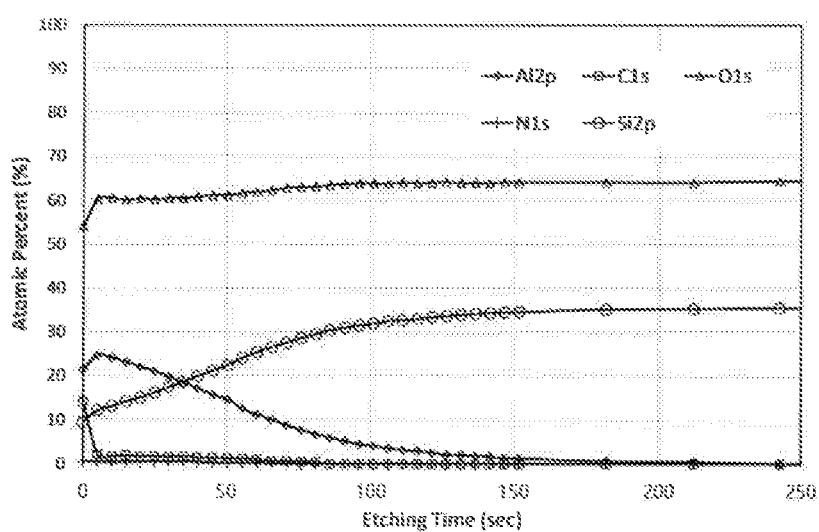
FIG. 6 is XPS results after ASD of $Al_2O_3$ film on the $SiO_2$ wafer using $(NMe_2)_2Al(-NEt-(CH_2)_2-NEt_2)$ at 200° C.
Figure 7:
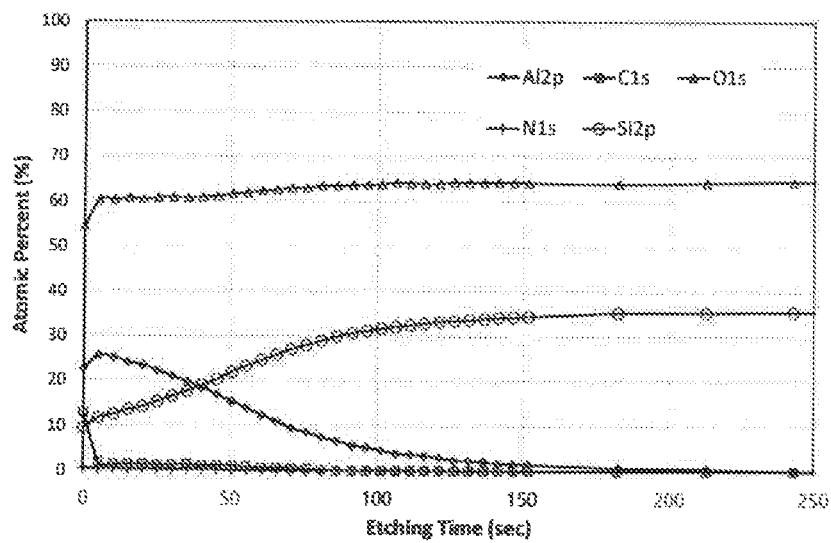
FIG. 7 is XPS results after ASD of $Al_2O_3$ film on the $SiO_2$ wafer using $(NMe_2)_2Al(-NEt-(CH_2)_2-NEt_2)$ at 250° C.

ASD of $Al_2O_3$ Film Using $(NMe_2)_2Al(\text{—}NEt\text{-}(CH_2)_2\text{—}NEt_2)$ on W and $SiO_2$ Wafers at Various Deposition Temperatures A tungsten (W) wafer and a $SiO_2$ wafer were placed in a container containing diluted HF (1%) for 1 min, then rinsed with DI water and dried with $N_2$ gas. Thereafter, both of the wafers were immersed in neat dimethylichlorosilane (DMDCS) for 24 hours. As a result of this step, a SAM layer was grown on the surface of the $SiO_2$ wafer and not grown on the surface of the W wafer. Then, both of the wafers were rinsed with acetone, ethanol and DI water and dried with $N_2$ gas. After that both of the wafers were dried under vacuum for 4 hours. Next, ALDs of metal-containing films on the W wafer and $SiO_2$ wafer were done in an ALD reaction chamber using $(NMe_2)_2Al(\text{—}NEt\text{-}(CH_2)_2\text{—}NEt_2)$ as a precursor and $H_2O$ as a co-reactant at temperatures of 150° C., 200° C. and 250° C., for 50 cycles, resulting in an $Al_2O_3$ film selectively deposited on the W wafer. The formed $Al_2O_3$ film has a thickness of about 5 nm after the first 50 cycles. FIG. 2 to FIG. 4 are XPS results after the ASD of the $Al_2O_3$ film on the W wafer using $(NMe_2)_2Al(\text{—}NEt\text{-}(CH_2)_2\text{—}NEt_2)$ at temperatures 150° C., 200° C. and 250° C., respectively. FIG. 5 to FIG. 7 are XPS results after ASD of $Al_2O_3$ film on the $SiO_2$ wafer using $(NMe_2)_2Al(\text{—}NEt\text{-}(CH_2)_2\text{—}NEt_2)$ at temperatures 150° C., 200° C. and 250° C., respectively. The XPS results of Al contents on the W wafer and the $SiO_2$ wafer at various temperatures show a selective deposition was obtained between the W wafer and $SiO_2$ wafer up to 250° C. The figures depict the Al contents on the W wafer much higher than that on the $SiO_2$ wafer. That is to say, the $Al_2O_3$ film was selectively deposited on the W wafer over the $SiO_2$ wafer. Because the SAM formation step generated a protect SAM layer on the $SiO_2$ wafer, the resulting $Al_2O_3$ deposition favored the W wafer.

Although the subject matter described herein may be described in the context of illustrative implementations to process one or more computing application features/operations for a computing application having user-interactive components the subject matter is not limited to these particular embodiments. Rather, the techniques described herein may be applied to any suitable type of user-interactive component execution management methods, systems, platforms, and/or apparatus.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A process of selectively depositing a metal-containing film, the process comprising the steps of:
    a) providing a surface having a plurality of materials exposed thereon simultaneously; and
    b) exposing the surface to a vapor of a metal-containing film-forming composition that contains a precursor having the formula:

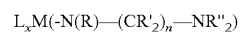

wherein M is a Group 12, Group 13, Group 14, Group 15, Group IV or Group V element; x+1 is the oxidation state of the M; L is an anionic ligand; R, R" each are independently a $C_1$-$C_{10}$ linear, branched or cyclic alkyl, alkenyl, or trialkylsilyl group; R' is H or a $C_1$-$C_{10}$ linear, branched or cyclic alkyl, alkenyl or trialkylsilyl group; n=1-4; and
    c) preferentially or selectively depositing a film on one or more of, but less than all of, the plurality of materials on the surface in a vapor deposition process,
        wherein at least one of the materials on the surface is at least partially blocked by a blocking agent thereby reducing or preventing a deposition of the metal-containing film on said blocked material.

2. The process of claim 1, wherein the vapor deposition process is an ALD process.

3. The process of claim 1, further comprising exposing the surface to a co-reactant selected from an oxidizer agent or a nitrigen agent.

4. The process of claim 3, further comprising the steps of repeating the exposing to the vapor of the metal-containing film-forming composition and the exposing to the co-reactant until a desired thickness of the metal-containing film is formed; and purging excess vapor of the metal-containing film-forming composition and excess co-reactant using an inert gas, respectively, to separate each exposure, wherein the inert gas is $N_2$, Ar, Kr or Xe.

5. The process of claim 3, wherein the co-reactant is selected from $O_3$, $O_2$, $H_2O$, $H_2O_2$, $D_2O$, ROH wherein R=$C_1$-$C_{10}$ linear or branched hydrocarbon, $NH_3$, NO, $N_2O$, hydrazines, amines or combinations thereof.

6. The process of claim 3, wherein the co-reactant is $H_2O$.

7. The process of claim 1, wherein the blocking agent forms a SAM layer on the at least one of the materials by dipping the surface in the blocking agent or vapor spraying the surface with the blocking agent.

8. The process of claim 1, wherein the plurality of the materials include at least a dielectric material and at least a metal material on the surface.

9. The process of claim 8, wherein the metal-containing film is deposited on the dielectric film but not deposited on the metal material by blocking the reactivity of the metal film by a metal blocking agent.

10. The process of claim 9, wherein the metal blocking agent is selected from a alkyl or fluoroalkyl compounds having a surface reactive chemical function group selected from phosphonic acids, carboxylic acids, thiols, or triazoles.

11. The process of claim 8, wherein the metal-containing film is deposited on the metal material but not deposited on the dielectric material by blocking the reactivity of the dielectric material by a dielectric blocking agent.

12. The process of claim 11, wherein the dielectric blocking agent is a compound having the formula $R_{4-a}SiX_a$, wherein each X are independently a surface hydroxyl reactive group (halide, alkylamino, alkoxy, acetamide, etc.), and each R are selected from H, a $C_1$-$C_{20}$ alkyl or fluoroalkyl group or mixture thereof.

13. The process of claim 1, wherein the surface is exposed to the precursor at a temperature raging from room temperature to approximately 500° C.

14. The process of claim 1, wherein the precursor is $(NMe_2)_2Al(-NEt-(CH_2)_2-NEt_2)$.

15. The process of claim 14, wherein the metal-containing film is an $Al_2O_3$ film.

16. A composition for selective deposition of a metal-containing film comprising a precursor having the formula:

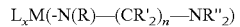

$$L_xM(-N(R)—(CR'_2)_n—NR''_2)$$

wherein M is a Group 12, Group 13, Group 14, Group 15, Group IV or Group V element; x+1 is the oxidation state of the M; L is an anionic ligand, independently selected from dialkylamine, alkoxy, alkylimine, bis(trialkylsilylamine), amidinate, betadiketonate, keto-imine, halide, or the like; R, R" each are independently a $C_1$-$C_{10}$ linear, branched or cyclic alkyl, alkenyl, or trialkylsilyl group; R' is H or a $C_1$-$C_{10}$ linear, branched or cyclic alkyl, alkenyl or trialkylsilyl group; n=1-4.

17. The composition of claim 16, wherein the precursor is $(NMe_2)_2Al(-NEt-(CH_2)_2-NEt_2)$.

18. The composition of claim 16, wherein the composition comprises between approximately 95% w/w and approximately 100.0% w/w of the precursor.

19. The composition of claim 16, wherein the composition comprises between approximately 0.0% w/w and approximately 5.0% w/w impurities.

20. A process of selectively depositing $Al_2O_3$ film, the process comprising the steps of:
a) providing a surface having at least one dielectric material and at least one metal material exposed thereon simultaneously;
b) exposing the surface to a vapor of $(NMe_2)_2Al(-NEt-(CH_2)_2-NEt_2)$; and
c) exposing the surface to a co-reactant $H_2O$, wherein the at least one dielectric material is at least partially blocked by a blocking agent dimethyldichlorosilane (DMDCS) from the deposition of the $Al_2O_3$ film through an ALD process.

* * * * *